United States Patent
Maijala et al.

(10) Patent No.: US 8,654,502 B2
(45) Date of Patent: Feb. 18, 2014

(54) APPARATUS, A METHOD FOR ESTABLISHING A CONDUCTIVE PATTERN ON A PLANAR INSULATING SUBSTRATE, THE PLANAR INSULATING SUBSTRATE AND A CHIPSET THEREOF

(75) Inventors: Juha Maijala, Kellokoski (FI); Petri Sirviö, Imatra (FI)

(73) Assignee: Stora Enso Oyj, Helsinki (FI)

( * ) Notice: Subject to any disclaimer, the term of this patent is extended or adjusted under 35 U.S.C. 154(b) by 503 days.

(21) Appl. No.: 12/991,598

(22) PCT Filed: May 9, 2008

(86) PCT No.: PCT/FI2008/050256
§ 371 (c)(1),
(2), (4) Date: Jan. 31, 2011

(87) PCT Pub. No.: WO2009/135985
PCT Pub. Date: Nov. 12, 2009

(65) Prior Publication Data
US 2011/0147071 A1    Jun. 23, 2011

(51) Int. Cl.
*H01H 47/00* (2006.01)

(52) U.S. Cl.
USPC .......... 361/268; 361/88; 156/277; 156/284; 204/209; 205/143; 419/6; 427/249.8; 428/137; 428/161; 428/209; 428/304.4; 428/328; 430/63; 451/527

(58) Field of Classification Search
USPC .............. 174/268, 88 R; 156/277, 284; 204/209.01, 209.03; 205/143; 419/6; 427/249.8; 428/137, 161, 209, 304.4, 428/328; 430/63; 451/527
See application file for complete search history.

(56) References Cited

U.S. PATENT DOCUMENTS

| 4,411,943 A | * | 10/1983 | Akao ........................... 428/161 |
| 4,698,907 A | | 10/1987 | Soszek |
| 4,735,847 A | * | 4/1988 | Fujiwara et al. ............. 428/209 |
| 4,740,657 A | * | 4/1988 | Tsukagoshi et al. ........ 174/88 R |

(Continued)

FOREIGN PATENT DOCUMENTS

| DE | 203 20 761 U1 | 3/2005 |
| EP | 1 841 301 A2 | 10/2007 |

(Continued)

OTHER PUBLICATIONS

Inquiry of the Substantive Examination issued May 22, 2012, in Russian Patent Application No. 2010148407, with English translation.

(Continued)

*Primary Examiner* — Xiaoliang Chen
(74) *Attorney, Agent, or Firm* — Birch, Stewart, Kolasch & Birch, LLP (57) ABSTRACT

An apparatus, a method, a planar insulating substrate and a chipset have been presented, comprising at least one module configured to establish a predefined pattern on a planar insulating substrate so that conductive particles can gather according to the predefined pattern. At least one another module is configured to transfer the conductive particles to the planar insulating substrate, wherein the conductive particles are arranged to gather according to the predefined pattern. A sintering module is configured to fuse the conductive particles on the planar insulating substrate, wherein the conductive particles are arranged to fuse according to the predefined pattern to establish a conductive plane on the planar insulating substrate. Embodiment of the invention relate to printable or printing electronics on a fibrous web.

16 Claims, 5 Drawing Sheets

(56) References Cited

U.S. PATENT DOCUMENTS

| | | | |
|---|---|---|---|
| 4,789,452 A * | 12/1988 | Morimoto et al. | 204/290.03 |
| 4,851,320 A | 7/1989 | Stein | |
| 4,877,508 A * | 10/1989 | Morimoto et al. | 204/290.01 |
| 5,110,384 A | 5/1992 | Dudek et al. | |
| 5,114,744 A | 5/1992 | Cloutier et al. | |
| 5,136,365 A * | 8/1992 | Pennisi et al. | 257/783 |
| 5,298,285 A * | 3/1994 | Jones et al. | 427/249.8 |
| 5,340,617 A | 8/1994 | Fasano et al. | |
| 5,932,055 A * | 8/1999 | Newell et al. | 156/245 |
| 6,059,952 A * | 5/2000 | Kang et al. | 205/143 |
| 6,127,294 A * | 10/2000 | Koiso et al. | 442/327 |
| 6,322,685 B1 * | 11/2001 | Kang et al. | 205/143 |
| 6,500,582 B1 * | 12/2002 | Sugikawa | 429/217 |
| 6,769,969 B1 * | 8/2004 | Duescher | 451/59 |
| 2002/0050320 A1 * | 5/2002 | Ikeda | 156/284 |
| 2003/0178313 A1 * | 9/2003 | Tanaka et al. | 205/74 |
| 2004/0031690 A1 * | 2/2004 | Tanaka et al. | 205/74 |
| 2004/0142165 A1 * | 7/2004 | Fujii et al. | 428/328 |
| 2004/0177921 A1 * | 9/2004 | Yamauchi | 156/277 |
| 2004/0235406 A1 * | 11/2004 | Duescher | 451/527 |
| 2005/0002818 A1 * | 1/2005 | Ichikawa et al. | 419/6 |
| 2005/0019683 A1 * | 1/2005 | Tomoyori et al. | 430/63 |
| 2005/0153249 A1 | 7/2005 | Yamaguchi et al. | |
| 2006/0182944 A1 * | 8/2006 | Leavitt et al. | 428/304.4 |
| 2006/0286369 A1 * | 12/2006 | Tanaka et al. | 428/332 |
| 2007/0178228 A1 | 8/2007 | Shiu et al. | |
| 2007/0218258 A1 | 9/2007 | Nees et al. | |
| 2008/0145607 A1 * | 6/2008 | Kajiwara et al. | 428/137 |

FOREIGN PATENT DOCUMENTS

| | | |
|---|---|---|
| GB | 678717 | 9/1952 |
| GB | 959425 | 6/1964 |
| GB | 1191909 | 5/1976 |
| JP | 64-13793 A | 1/1989 |
| JP | 2-208995 A | 8/1990 |
| JP | 3-89591 A | 4/1991 |
| JP | 5-74971 A | 3/1993 |
| JP | 6-53634 A | 2/1994 |
| NL | 8801450 A | 1/1990 |
| SU | 657862 | 4/1979 |
| WO | WO 03/059027 A1 | 7/2003 |
| WO | WO 2008/006941 A1 | 1/2008 |

OTHER PUBLICATIONS

International Search Report, PCT/FI2008/050256, mailed on Feb. 5, 2009.

Extended European Search Report issued Dec. 5, 2011, in European Patent Application No. 08761652.0.

English translation of Office Action issued Jul. 24, 2012, in Japanese Patent Application No. 2011-507952.

Japanese Office Action, issued May 10, 2013, for Japanese Patent Application No. 2011-507952.

Australian Examination Report, dated May 1, 2013, for Australian Application No. 2008356134.

* cited by examiner

APPARATUS, A METHOD FOR ESTABLISHING A CONDUCTIVE PATTERN ON A PLANAR INSULATING SUBSTRATE, THE PLANAR INSULATING SUBSTRATE AND A CHIPSET THEREOF

TECHNICAL FIELD OF THE INVENTION

The invention concerns an apparatus for establishing a conductive pattern on a planar insulating substrate. Furthermore the invention concerns a method for establishing a conductive pattern on a planar insulating substrate. Furthermore the invention concerns a planar insulating substrate comprising the accordingly established conductive pattern. Furthermore the invention concerns a chipset established on a planar insulating substrate accordingly.

BACKGROUND

Printing of electronics, especially on flexible substrates, pursues electronic components and applications for logistical solution, disposable electronics, even to printed displays. Nowadays, the printed electronics applications utilize methods familiar in traditional manufacture of electronic components such as electroplating and screen printing. Unfortunately, these methods are slow, not well suitable for porous substrates and/or substrates in web form. Also flexo and rotogravure printing has been used to print electronic components. Problems with these above mentioned known solutions are that they create structures with discontinuity (due to 20 halftone dots), solvent evaporation and absorption of components in porous structures (with liquid materials). The main challenge with conductive polymers are insufficient electric conductivity and protection against effects of environment e.g. oxidation.

In addition, several techniques for printing conductive patterns using conductive pastes, gels and inks are known. However there are some problems in the known techniques for printing the conductive patterns. Application of liquid-phase materials is undesirable due to their complex processing and relatively low conductivities and/or resolution of the printed traces. Removal of the solvents or auxiliary agents initially included in the composition requires time consuming steps.

The known solutions referred to above set certain limits to substrates which can be used these known solutions. None of them is well suitable for paper, fibrous web, board substrates or the like due to very high temperatures or substrate-weakening local compression used. On the other hand, deposition masks, stencils or xreens are not desirable as far as speed, customizability and flexibility of the process is aimed at, since they make the deposition process unnecessarily complex and limit the obtainable resolution.

SUMMARY

It is the object of the invention to provide relatively efficient and simple establishment of conductive patterns on a planar insulating surface.

In accordance with an aspect of the invention there is provided an apparatus, comprising
at least one module configured to establish a predefined pattern on a planar insulating substrate so that conductive particles can gather according to the predefined pattern,
at least one another module configured to transfer the conductive particles to the planar insulating substrate, wherein the conductive particles are arranged to gather according to the predefined pattern, and
a sintering module configured to fuse the conductive particles on the planar insulating substrate, wherein the conductive particles are arranged to fuse according to the predefined pattern to establish a conductive plane on the planar insulating surface.

In accordance with another aspect of the invention there is provided a method, comprising
establishing a predefined pattern on a planar insulating substrate so that conductive particles can gather according to the predefined pattern,
transferring the conductive particles to the planar insulating substrate, wherein the conductive particles are arranged to gather according to the predefined pattern, and
sintering the conductive particles on the planar insulating substrate, wherein the conductive particles are arranged to fuse according to the predefined pattern to establish a conductive plane on the planar insulating substrate.

In accordance with yet another aspect of the invention there is provided a planar insulating substrate, comprising
a predefined pattern situated on the planar insulating substrate so that conductive particles can gather according to the predefined pattern,
conductive particles sintered on the planar insulating substrate, wherein the conductive particles are arranged to fuse according to the predefined pattern to establish a conductive plane on the planar insulating substrate, and wherein the conductive particles are arranged to gather according to the predefined pattern.

In accordance with yet another aspect of the invention there is provided a chipset, comprising
a predefined pattern situated on the planar insulating substrate so that conductive particles can gather according to the predefined pattern,
conductive particles sintered to establish a conductive plane on the planar insulating substrate, wherein the conductive particles are arranged to fuse according to the predefined pattern to establish the conductive plane on the planar insulating substrate, and wherein the conductive particles are arranged to gather according to the predefined pattern.

Various further embodiments of the invention allow relatively accurate and convenient establishment of conductive planes on a planar insulating surface.

BRIEF DESCRIPTION OF THE DRAWINGS

Various further embodiments of the invention will now be described, by way of demonstration purposes only, with reference to the accompanying drawings, in which.

DESCRIPTION OF FURTHER EMBODIMENTS

Figure 1:
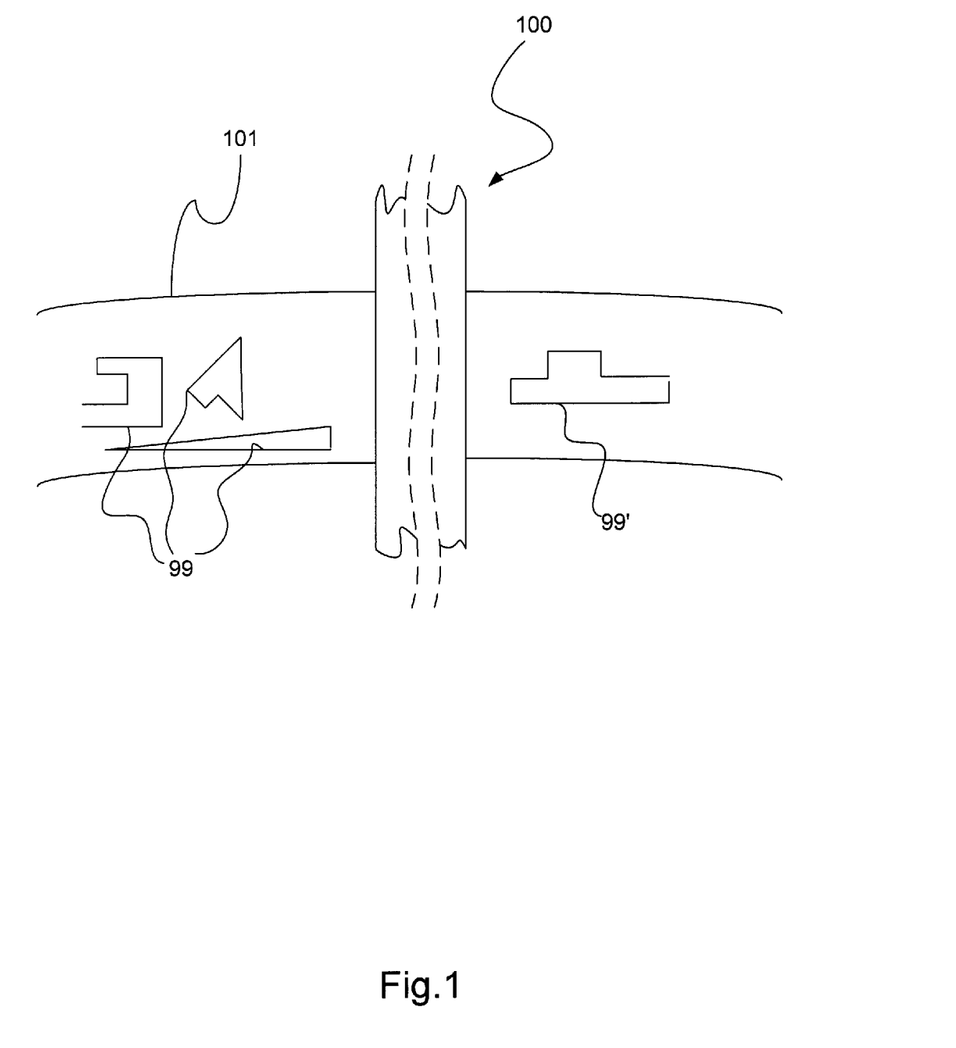
FIG. 1 depicts an overview of a part of an apparatus configured to establish a conductive pattern on a planar insulating substrate, wherein the patterns are shown in accordance with an embodiment of the invention.

FIG. 1 depicts an overview of a portion of an apparatus 100 configured to establish conductive patterns 99 on a planar insulating substrate 101 wherein the patterns 99 are shown in accordance with an embodiment of the invention. Various embodiments of the invention are based on (micro)particles 102 (not shown in the FIG. 1), which can be deposited and permanently affixed to on various substrates 101, at the same time increasing the conductivity of the pattern 99 being deposited. This is achieved by at least one module of the apparatus 100, which is configured to establish a predefined pattern 99 on a planar insulating substrate 101 so that conductive particles 102 can gather according to the predefined pattern 99. Furthermore at least one another module of the apparatus 100 is configured to transfer the conductive particles to the planar insulating substrate 101, wherein the conductive particles 102 are arranged to gather according to the predefined pattern. Furthermore a sintering module of the apparatus 100 is configured to fuse the conductive particles 102 on the planar insulating substrate 101, wherein the conductive particles 102 are arranged to fuse according to the predefined pattern 99 to establish a conductive plane 99' on the planar insulating surface 101. Depending on the deposition used, no intermediate stages are required (if particles deposited in dry form or a drying stage for the deposited material is employed (if particles deposited in a liquid suspension)).

Various embodiments of the invention are suited inter alia for dry-state conductive (including semiconductive) particles 102, for example microparticles in powder form. The conductive particles 102 may be metallic, polymeric, or a combination thereof. The resolution of the created structures may dependent on the particle size of the powdered material, whereas in the deposition and sintering processes the composition of the material is generally of importance.

The substrate 101 can be almost any insulating and planar sheet, web, or fiber or fibrous web or the like. Paper, board and polymer films (plastics) have been found to suit well for the process, but other similar non-conductive surfaces may be also used. Paper or board can be coated, uncoated, wood-free or wood-containing. Multilayered substrates are also usable. Other possible substrates include for example textiles, non-woven materials, circuit boards of electronics industry, moulded articles, glass, construction materials, such as wallpapers and floor coatings unfired and fired ceramics, (bio)polymer bases and composites. Each one of the listed substrates has its own application areas and advantages. In particular a further embodiment of the invention is suitable for substrate that has a shattering or deformation point below 300° C., in particular below 250° C., even below 200° C., that is, at least various paper and plastic grades not tolerating high temperatures.

Figure 2A:
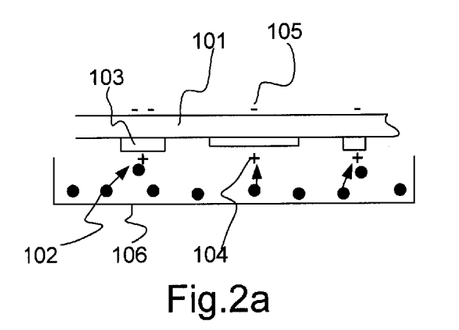
FIG. 2a depicts a cross section view of a portion of an apparatus configured to establish a conductive pattern on a planar insulating substrate, wherein conductive particles are being gathered and attached to a coupling agent on the substrate in accordance with an embodiment of the invention.

FIG. 2a depicts a cross section view of a portion of an apparatus 100 configured to establish a conductive pattern 99 on a planar insulating substrate 101, wherein conductive particles 102 are being gathered and attached to a coupling agent 103 on the substrate 101 in accordance with an embodiment of the invention. FIG. 2a depicts an embodiment of the at least one another module configured to transfer the conductive particles 102 to the planar insulating substrate 101, wherein the conductive particles 102 are arranged to gather according to the predefined pattern 99. A container 106 comprises the conductive particles 102. The planar insulating substrate 101 comprises the coupling agent 103. In an embodiment of the invention the coupling agent 103 may be adhesive or the like. The coupling agent 103 is situated so that the particles may attach to it. Furthermore the coupling agent 103 establishes the predefined pattern 99 (not shown in FIG. 2) on the substrate 101 in the embodiment of FIG. 2a. The substrate 101 contains also charges, a negative charge 105 and a positive charge 104.

In a further embodiment the charges 104,105 are generally uniformly (not shown) established to the substrate 101. In this further embodiment the charges attracts by the electro-magnetic fields the particles 102 to the substrate 101. The coupling agent 103 takes care of the further attachment of the particles 102 to the substrate 101, in a place on the substrate 101 where the coupling agent 103 is situated. At other locations, where there is no coupling agent 103, the particles do not attach to the substrate 101.

In an embodiment the charges 104,105 are established to the insulating substrate 101 according to the predefined pattern 99. Therefore the charges 104,105 are situated generally according to the predefined pattern 99. Furthermore the locations of the charges 104 correspondences with the locations of the coupling agent 103.

The charges 104 attract the conductive particles 102 as shown by arrows in FIG. 2a. The force of the electro-magnetic field draws the conductive particles 102 to the coupling agent 103. The coupling agent 103 attaches the conductive particles 102 to the substrate 101. The attachment can be performed while the substrate 101 is moving, even at relatively high speed.

Figure 2B:
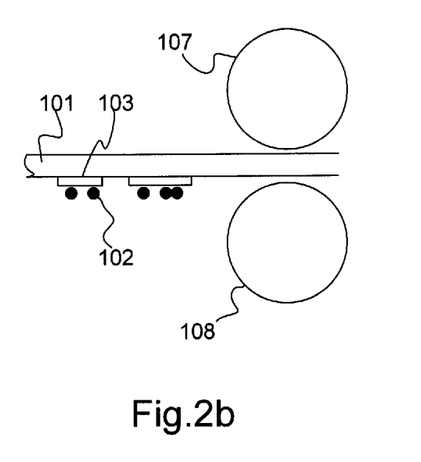
FIG. 2b depicts a cross section view of a portion of an apparatus configured to establish a conductive pattern on a planar insulating substrate, wherein particles have been coupled to the substrate before sintering in accordance with an embodiment of the invention.

FIG. 2b depicts a cross section view of a portion of an apparatus 100 configured to establish a conductive pattern 99' on a planar insulating substrate 101, wherein conductive particles 102 have been coupled to the substrate 101 before sintering in accordance with an embodiment of the invention. In the embodiment of FIG. 2b the conductive particles 102 are being attached and coupled to the substrate 101 by the coupling agent 103. The sintering process in the embodiment comprises sintering rolls 107 and 108 situated on opposite sides of the substrate 101. Thus after the conductive particles 102 are transferred on the surface of the substrate 101, particles 102 are sintered to form continuous, conductive structures 99' (not shown in FIG. 2b). The sintering occurs under temperature and pressure, preferably in a separate or semiseparate sintering nip, which are illustrated, in FIG. 2b for example. A separate sintering nip comprises two separate rolls 107,108, whereas a semiseparate sintering nip utilizes the electrode roll as a counter-roll for the sintering roll (not shown). One or both of the rolls 107,108 is heated in order to achieve the desired sintering temperature. Depending on the chosen temperature, also a pressure sufficient to cause sintering to occur is generated in the sintering nip. Alternatively instead of sintering in a roll nip, belt or long nip such as shoe-nip can be used. In these further embodiments the nip length can be several millimetres, typically between 2-500 mm, and have pressures varying between 10-20 000 kPa. Configurations for heating uses same principles as with roll nip systems described above. In the sintering the desired conductive (including semiconductive, depending on the properties of used material) surface pattern 99' is formed. Thereby the final chipset 99' may be established on the substrate 101.

Sintering System

In the sintering process the conductive particles 102 are sintered together to form a continuous, conductive structure 99'. The sintering procedure may utilize simply pressure and temperature (either in a roll or plate configuration). This is used to exceed the melting and sintering temperature of the used conductor material. Either one of both of the rolls 107, 108, plates or belts in the sinter nip may be heated. The surface materials of the heated material should tolerate the temperature used (e.g., 50° C.-250° C.) without significant deformation. Possible surface materials for the roll are e.g. tungsten carbide, hard chrome, PTFE covers and its derivatives and ceramic material with anti-sticking properties (low surface energy). The sintering may occur in direct contact with the heated roll 108 or the heat may be transferred through the substrate material (107). Also both contacting rolls 107, 108 may be heated to increase heat transfer in the nip. For improving the affixation of the conductive particles 102 to the substrate 101, it is preferred that at least the roll 107 or plate coming into contact with the surface of the substrate 101 not comprising the particle-formed pattern (second roll) is heated. The roll 108 in contact with the powder (first roll) may be in considerably lower temperature, even unheated and cooled.

Figure 3:
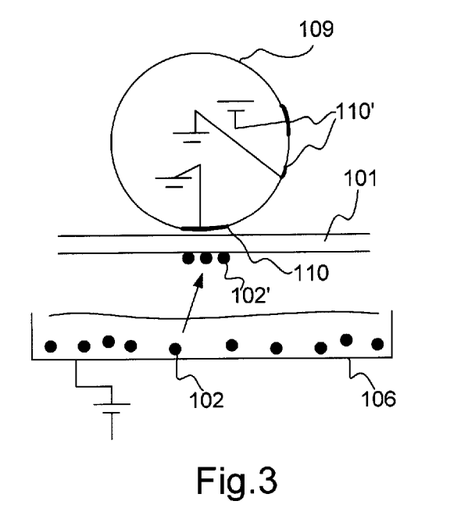
FIG. 3 depicts a cross section view of a portion of an apparatus configured to establish a conductive pattern on a planar insulating substrate, wherein electric field is used to transfer conductive particles in accordance with an embodiment of the invention.

FIG. 3 depicts a cross section view of a portion of an apparatus 100 configured to establish a conductive pattern 99 on a planar insulating substrate 101, wherein electric field is used to transfer conductive particles 102 in accordance with an embodiment of the invention. The planar insulating substrate 101 comprises the coupling agent 103, preferably situated on the surface of the substrate 101 facing the conductive particles 102. The embodiment of FIG. 3 comprises an electric roll 109. The electric roll 109 comprises poles 110 which are connected to a voltage source. On the opposite side of the roll a container 106 containing the conductive particles 102 is located. The substrate 101 is between these two. When the pole 110 comes close to the substrate 101 as the roll 109 rotates, the force of the electro-magnetic field starts to draw the conductive particles 102 so that the conductive particles 102' comes to contact and attaches to the coupling agent 103, thereby to the substrate 101. The poles 110' are too far away from the conductive particles 102 so that they do not draw the conductive particles 102,102'. In the embodiment of FIG. 3, the predefined pattern 99 may be established according to the location and the pattern of the poles 110 on the circle of the roll 109. Furthermore or alternatively, the coupling agent 103 may be of the predefined pattern. Therefore the pattern is established according to the combination of both the coupling agent 103 and the poles 110 or simply by the coupling agent 103. Furthermore the roll 109 may be adapted to move to create a certain pattern 99 of the attached particles 102' on the substrate 101. Even furthermore the poles 110 may be guided by controlling the voltage of the poles 110 to establish the predefined pattern 99.

Figure 4A:
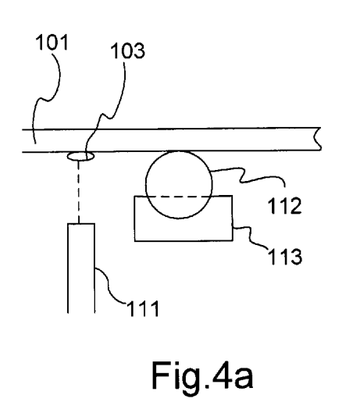
FIG. 4a depicts a cross section view of a portion of an apparatus configured to establish a conductive pattern on a planar insulating substrate, wherein a coupling agent is transferred to the substrate in accordance with an embodiment of the invention.

FIG. 4a depicts a cross section view of a portion of an apparatus 100 configured to establish a conductive pattern 99 on a planar insulating substrate 101, wherein a coupling agent 103 is transferred to the substrate 101 in accordance with an embodiment of the invention. FIG. 4a depicts two alternative ways of transferring the coupling agent 103 to the substrate 101. Cannon 111 shoots or sprays the coupling agent 103 to the surface of the substrate 101. The cannon 111 may be arranged to spray the coupling agent 103 according to the predefined pattern 99 or by generally uniformly. Alternatively the coupling agent 103 may be transferred to the substrate 101 by a roll 112. The roll 112 transfers the coupling agent from a container 113 containing the coupling agent 103. The roll 112 may be controlled to move to create the pattern 99. Also the roll may contain a predetermined shape or ornaments, i.e. predetermined pattern, so as to create the pattern 99 on the substrate 101.

Figure 4B:
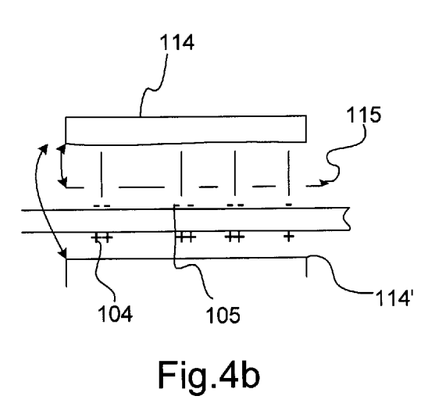
FIG. 4b depicts a cross section view of a portion of an apparatus configured to establish a conductive pattern on a planar insulating substrate, wherein a mask and a voltage source are used to create predefined charges to the substrate in accordance with an embodiment of the invention.

FIG. 4b depicts a cross section view of a portion of an apparatus 100 configured to establish a conductive pattern 99 on a planar insulating substrate 101, wherein a mask 115 and a voltage source and drain 114,114' are used to create predefined charges 104,105 to the substrate 101 in accordance with an embodiment of the invention. The mask 105 is used in the embodiment to establish the pattern 99 with the charges 105 on the substrate 101. The substrate 101 is transferred between the voltage sources 114 and 114'. Thereby there is an electric voltage, which creates the charges 104,105 to certain positions to the substrate 101. The mask 115 is thereby used to create the charges 104,105 according to the predefined pattern 99.

Figure 4C:
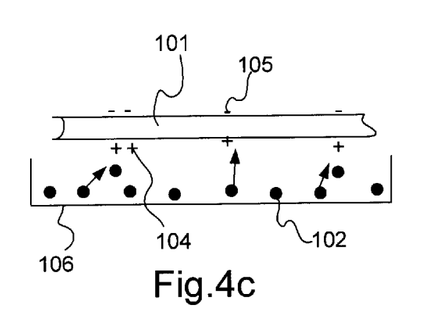
FIG. 4c depicts a cross section view of a portion of an apparatus configured to establish a conductive pattern on a planar insulating substrate, wherein the predefined charges attract and gather the conductive particles to the substrate in accordance with an embodiment of the invention.

FIG. 4c depicts a cross section view of a portion of an apparatus 100 configured to establish a conductive pattern 99 on a planar insulating substrate 101, wherein the predefined charges 104 attracts and gathers the conductive particles 102 to the substrate 101 in accordance with an embodiment of the invention. The substrate 101 moves besides the container 106 containing the conductive particles 102. Generally the substrate 101 moves in relation to the container 106 so that a distance is substantially the between the substrate 101 and the container 106. The substrate 101 contains the charges 104 according to the predefined pattern 99. The charges 104 attract the conductive particles 102 to the substrate 101. The substrate contains the coupling agent 103 on the side facing the conductive particles 102. Accordingly the conductive particles 102 gather towards the charges 104 and are attached to the substrate 101 by the coupling agent 103. Therefore, the conductive particles 102 are attached to the substrate 101 according to the predefined pattern 99.

Figure 4D:
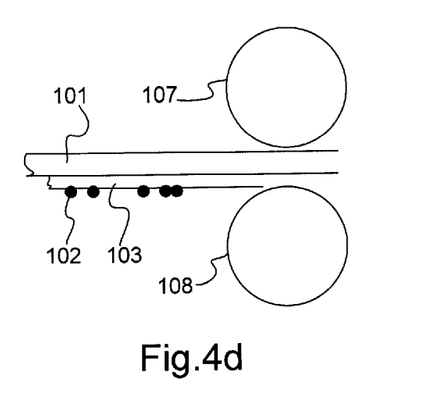
FIG. 4d depicts a cross section view of a portion of an apparatus configured to establish a conductive pattern on a planar insulating substrate, wherein the conductive particles are coupled to the substrate before the sintering in accordance with an embodiment of the invention.

FIG. 4d depicts a cross section view of a portion of an apparatus 100 configured to establish a conductive pattern 99 on a planar insulating substrate 101, wherein the conductive particles 102 are coupled to the substrate 101 before sintering in accordance with an embodiment of the invention. In the embodiment of FIG. 4d the substrate 101 contains the generally uniform layer of coupling agent 103. The conductive particles 102 have been transferred to the substrate 101 to establish the predefined pattern 99. Otherwise the embodiment of FIG. 4d is similar to the embodiment of FIG. 2b.

Figure 5:
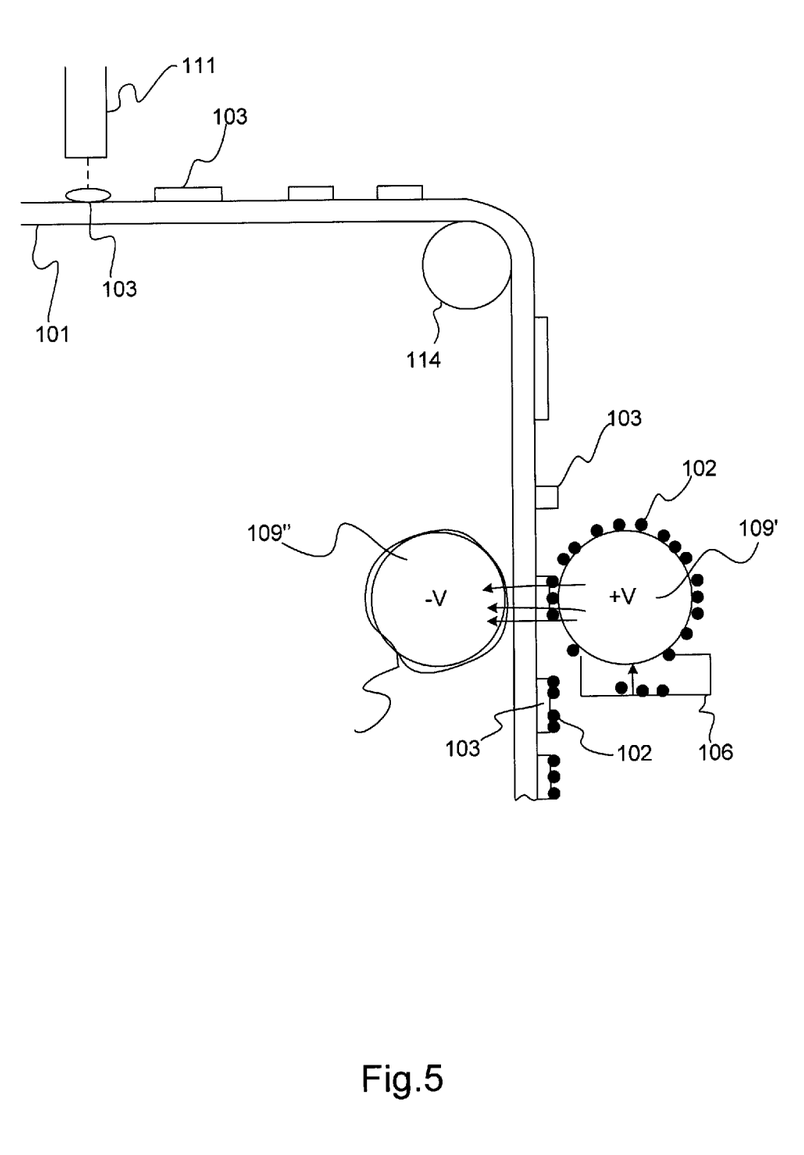
FIG. 5 depicts a cross section view of an apparatus configured to establish a conductive pattern on a planar insulating substrate in accordance with an embodiment of the invention, wherein the coupling agent is spread according to a predefined pattern to the substrate and an electric roll is used.

FIG. 5 depicts a cross section view of an apparatus 100 configured to establish a conductive pattern 99 on a planar insulating substrate 101 in accordance with an embodiment of the invention, wherein the coupling agent 103 is spread according to the predefined pattern 99 to the substrate 101 and electric roll 109' is used. In the embodiment of FIG. 5 the substrate 101 contains the coupling agent 103 as predefined pattern 99. Thus the coupling agent 103 has been spread to the substrate 101 so as to create the predefined pattern 99. The substrate 101 moves forwards. The roll 109' rotates. The roll 109' contains a voltage source +V. The roll 109" contains a voltage drain −V. Thereby the roll 109' gathers and attracts conductive particles 102 from the container 106 to the surface of the roll 109', when the roll 109' rotates. When the roll 109' rotates and the substrate 101 moves, the conductive particles 102 come into contact with the coupling agent 103. The conductive particles 102 are attached to the coupling agent 103. Therefore the conductive particles 102 establish the predefined pattern 99 on the surface of the substrate 101. Those conductive particles 102 that do not come into contact with the coupling agent 103 are not attached to the substrate 101 but remain on the surface of the roll 109'.

Figure 6:
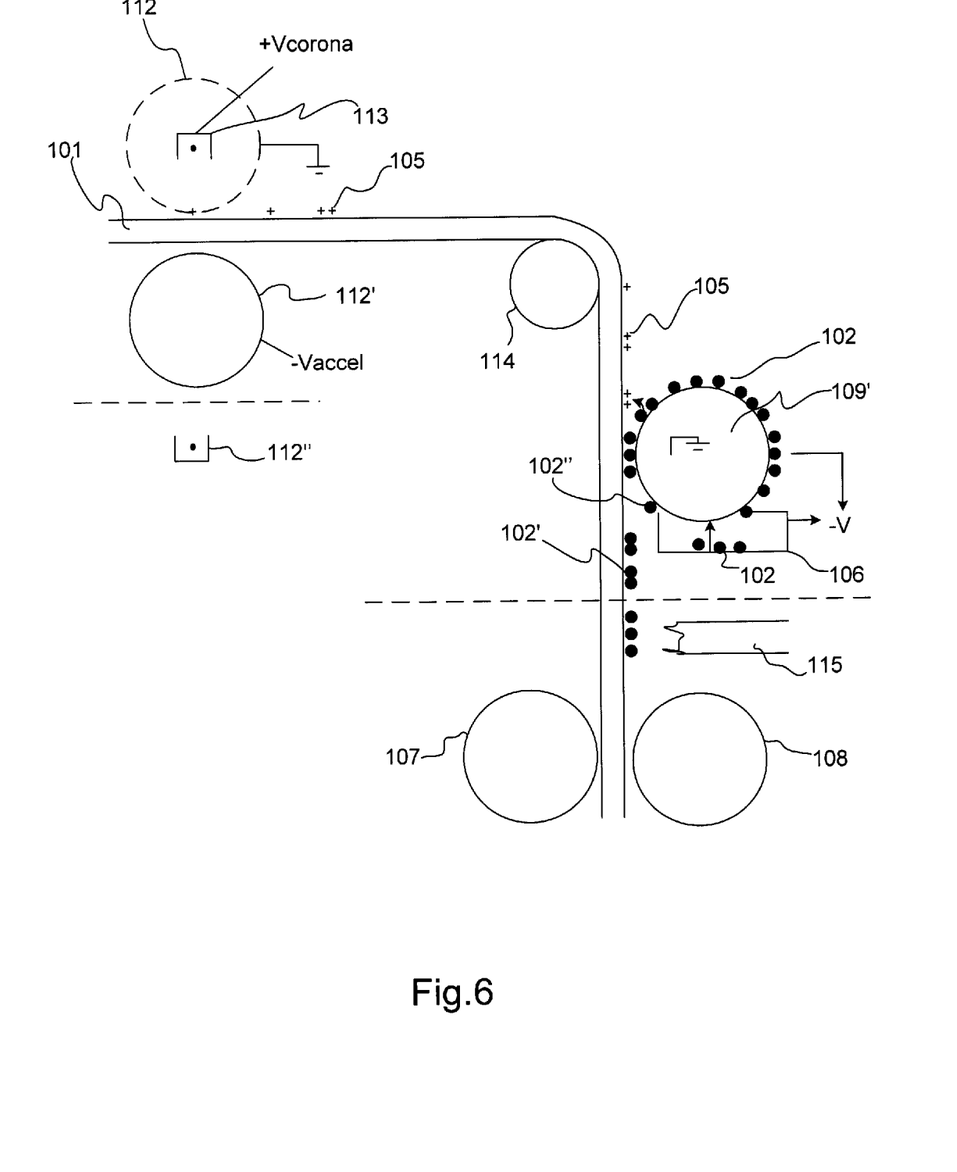
FIG. 6 depicts a cross section view of an apparatus configured to establish a conductive pattern on a planar insulating substrate in accordance with an embodiment of the invention, wherein electric rolls are used to create charged patterns on the substrate and to transfer conductive particle to the substrate accordingly.

FIG. 6 depicts a cross section view of an apparatus 100 configured to establish a conductive pattern 99 on a planar insulating substrate 101 in accordance with an embodiment of the invention, wherein electric rolls 112,112',112" are used to create charged patterns 99,105 on the substrate 101 and to attach conductive particles 102 to the substrate 101 accordingly. Electric roll 112 contains a voltage source 113 to create +Vcorona voltage. The roll 112 contains a mask also so as to establish the pattern 99 by the charges 105. There can be two or more alternatives to the corona voltage such as 112'—Vaccel or a voltage drain 112". The mask is designed so that according to the predefined pattern of the mask the charges 105 are created on the substrate 101 accordingly. Thus the mask and the charges 105 create the predefined pattern 99 in the embodiment of FIG. 6. The embodiment of FIG. 6 contains also electric roll 109'. In the embodiment of FIG. 6 the substrate 101 does not contain the coupling agent 103. The substrate 101 moves forwards and the rolls rotate. The roll 109' may contain a ground. There is furthermore a drain −V to create the electric field. Thereby the roll 109' gathers and attracts conductive particles 102 from the container 106 to the surface of the roll 109', when the roll 109' rotates. When the roll 109' rotates and the substrate 101 moves, the conductive particles 102 come into contact with the charges 105. The conductive particles 102 are attached to the substrate 101 by the charges 105. Therefore the conductive particles 102 are attached on the substrate 101. The conductive particles 102 establish the predefined pattern 99 on the surface of the substrate 101 in accordance with the pattern of the charges 105. Those conductive particles 102 that do not come into contact with the charges 105 are not attached to the substrate 101 but remain on the surface of the roll 109'. The sintering portion contains a heater 115, for example a radiator/IR. Furthermore the sintering portion contains also rolls 108 and 107. The sintering process may operate generally similarly as in the embodiments of FIGS. 2b and 4d.

Conductive Particles

As discussed above some embodiments of the invention use conductive particles 102. A non-limiting example of the conductive particles is metallic microparticles. For a further embodiment, low melting point metals and metal alloys are applied. Especially tinbismuth alloy is verified to be suitable for the application. In this context, low melting point metals and alloys include materials having melting points of less than 300° C., typically 50-250° C., in particular 100-200° C. Suitable metals include, e.g. tin, bismuth, indium, zinc, nickel, or similar. The mentioned metals are also preferred components of suitable alloys for further embodiment, as they have the capability of creating low melting point alloys. For example, tin-bismuth, tin-bismuth-zinc, tin-bismuth-indium or tin-bismuth-zinc-indium in different ratios has proven advantageous in further embodiments of the invention. Changing the ratios of these metals in the alloy can considerably change the melting behaviour of the alloy. Tin-containing alloys, where the ratio of tin in the alloy is 20-90 wt-%, preferably 30-70 wt-%. The composition 15.6 wt-% of tin 36.1 wt-% of bismuth and 48.3 wt-% on indium results in a melting point of as low as 59° C. Hence, really low-temperature applications are possible.

The size of the conductive particles, for example of metal or metal alloy particles, may be between 0.5 (or lower) and 100 µm (even higher), in 5 very high-resolution applications sometimes between 1 and 20 µm. The particles may comprise essentially 100% of metal. That is, no auxiliary agents are needed contained in the particles, mixed in the powder or applied in advance on the substrate order to carry out the further embodiments.

Other Materials

In a further embodiment conductive polymers, such as polyaniline (PANI), poly(3,4-ethylenedioxythiophene) (PEDOT), may be also used in the deposition as conductive particles, however the infusible nature of conducting polymers sets challenges to sintering of materials. Basically, polymer with intrinsic conductivity does not melt or dissolve in any ordinary solvents. However, they have degradation well above 200° C. enabling them to be blended with various synthetic polymers such as polypropylene (PP), polyethylene (PE), polyethylene-CO-methylacrylate (EMA), ethylene-propylene-diene terpolymer (EPDM) etc. These composite materials have still conductivity of semiconductor level.

Particles Container

Some embodiments of the invention use the particles container 106. An example of the particles container may be a powder container or the like. The housing of the container 106 may be brought in contact with insulating structure, particles or surfaces, through which they attain charge. After this they are transferred on the transfer roll surface, by means of an electric field, for example. Usually a certain threshold voltage is required in order for the charge to distribute evenly to the particles in the particle carrier. The level of the threshold voltage depends on the type of particles. In some example tin-bismuth alloy typically has a voltage of about 200 V.

In a further embodiments in the container 106 fluidization is applied in order to create homogonous dispersions. This ensures even transfer and deposition of particles to the transfer roll. Fluidisation can be made with air, mechanic vibration and by using repulsive electrostatic forces (with conductive particles).

Roll

Some embodiments of the invention use various rolls such as references 109,112. The transfer roll may be electrically passive. The transfer roll may comprise electrodes, which are in different potential than the particle deposited on the surface of the transfer roll. This potential difference may be created also with different surface charges in surface of roll, belt or like. The electric field between the container and the transfer roll is created to these electrodes. When an electric field is formed between the container (and conductive particles in it) and transfer roll, the charged particles transfer due to the electric field to the surface of the transfer roll.

Electrode Roll

Some embodiments of the invention use roll 109,112, which is being electrified. The electrode in its simplest form is roll comprising a metal roll, which is insulated from the other system components and is in opposite potential to the charged particles. The purpose is to create an electric field between the transfer roll (and with the particles on its surface) and the electrode roll for enabling transfer of the particles 102 to the surface of the substrate 101. In addition to this in particle transfer corona charging can be used to create a potential difference between the charged particles and the substrate. The opposite side of the substrate can be charged with ions from corona charging and the other side of the substrate is in contact or in close proximity to charged particles and thus particle transfer occurs.

Detach System

After the particles 102 have been transferred to the substrate 101 surface there may be need for detachment of the substrate 101 and the particles 102 from the roll. Depending on the dielectric properties (both volume and surface resistivity) of the substrate 101, tix particles have a tendency to sustain the electrostatic force towards the electrode roll 109. This is caused by the potential difference between the particles 102 and the roll 109. To decrease the electrostatic force between the particles and the electrode roll 109, several actions can be made. First, the moisture content of the web with fiber-based materials (paper and board) can be increased to enable charge transfer from the particle to the web with fiber-based and polymer films or the like. Second, an alternative current ionizer can be used to neutralize the charges of the particles. Third, the potential difference may be arranged to remain stable until the charge of the particles decays (for example by allowing the web be in contact with the electrode roll for a longer period). Fourth, the particles may be sintered while still in contact with the electrode. When paper or board is used as a substrate and a moisture-dependent detaching is utilised, the relative humidity of the process environment is preferably about 20-90%, typically 30-60%. This relative humidity means for example paper moisture contents between 2-20%/0. This provides the charged particles a suitable charge decay time for the detaching.

Ramifications and Scope

Although the description above contains many specifics, these are merely provided to illustrate the invention and should not be construed as limitations of the invention's scope. It should be also noted that the many specifics can be combined in various ways in a single or multiple embodiments. Thus it will be apparent to those skilled in the art that various modifications and variations can be made in the apparatuses and processes of the present invention without departing from the spirit or scope of the invention.

The invention claimed is:

1. An apparatus, comprising
    at least one module configured to establish a predefined pattern on a planar insulating substrate so that at least partly metallic conductive particles can gather according to the predefined pattern, wherein the planar insulating substrate is adapted to a shattering or deformation point below 300° C. without significant shattering or deformation at said temperature,
    at least one another module configured to transfer the metallic conductive particles to the planar insulating substrate, wherein the metallic conductive particles are arranged to gather according to the predefined pattern, and
    a sintering module configured to fuse at least partly the metallic conductive particles on the planar insulating substrate, wherein metal of the metallic conductive particles are arranged to at least partly fuse according to the predefined pattern so as to establish a conductive plane on the planar insulating substrate, wherein
    the at least one module comprises a spreading module configured to spread a coupling agent on the planar insulating substrate, the coupling agent comprising charges so as to create a force of electric field for attracting the conductive particles and thereby establishing said predefined pattern according to which the conductive particles can gather.

2. The apparatus according to claim 1, wherein the planar insulating substrate comprises a fiber based product, such as a fibrous web.

3. The apparatus according to claim 2, wherein the fiber based product comprises a paper or a board or a polymeric film.

4. The apparatus according to claim 1, wherein the conductive plane on the planar insulating surface comprises a portion of an electrical circuit, an electrical circuit or a chipset.

5. The apparatus according to claim 1, wherein the spreading module comprises a cannon.

6. The apparatus according to claim 1, wherein the spreading module comprises a roll and a container, wherein the roll is configured to transfer the coupling agent from the container to the substrate.

7. The apparatus according to any of claims 1-4, 5, and 6, wherein the coupling agent comprises an adhesive.

8. The apparatus according to claim 1, wherein the at least one module comprises an electric roll configured to establish the charges on a surface of the substrate according to the predefined pattern.

9. The apparatus according to claim 8, wherein the at least one another module comprises another electric roll, which is configured to transfer the conductive particles from a container to the substrate so that the conductive particles are attached to the another electric roll by a force of electromagnetic field and transferred to the substrate and attached to the substrate by the charges situated on the surface of the substrate.

10. The apparatus according to claim 1, wherein the at least one another module comprises a container for the conductive particles so that the conductive particles are transferrable to the surface of the substrate according to the predefined pattern.

11. The apparatus according to claim 10, wherein charges on the surface of the substrate attracts the conductive particles to the surface and adhesive attaches the conductive particles to the surface according to the predefined pattern, wherein the adhesive and the charges both are situated according to the predefined pattern.

12. The apparatus according to claim 10, wherein the at least one another module further comprises an electric roll configured to transfer the conductive particles from the container to the substrate so that the conductive particles are attached to the electric roll by a force of electromagnetic field and transferred to the substrate and attached to the substrate by an adhesive situated on the surface of the substrate.

13. The apparatus according to claim 10, wherein the at least one another module further comprises a mask, a voltage source and a voltage drain to create charges according to the predefined pattern on the substrate, wherein the charges on the surface of the substrate attracts the conductive particles to the surface and adhesive attaches the conductive particles to the surface according to the predefined pattern.

14. The apparatus according to claim 13, wherein the adhesive is uniformly distributed on the substrate so that the charges attracts the conductive particles according to the predefined pattern and adhesive attaches the conductive particles to the substrate.

15. The apparatus according to claim 1, wherein the sintering module comprises two rolls, wherein at least one roll of the two rolls is heated.

16. The apparatus according to claim 15, wherein the sintering module further comprises a blower heater.

* * * * *